US011238914B2

(12) United States Patent
Zawodny (10) Patent No.: US 11,238,914 B2
(45) Date of Patent: Feb. 1, 2022

(54) APPARATUSES AND METHODS FOR COMPUTE COMPONENTS FORMED OVER AN ARRAY OF MEMORY CELLS

(71) Applicant: Micron Technology, Inc., Boise, ID (US)

(72) Inventor: Jason T. Zawodny, Grand Rapids, MI (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/107,463

(22) Filed: Nov. 30, 2020

(65) Prior Publication Data

US 2021/0110858 A1    Apr. 15, 2021

Related U.S. Application Data

(63) Continuation of application No. 16/526,198, filed on Jul. 30, 2019, now Pat. No. 10,854,269, which is a
(Continued)

(51) Int. Cl.
 *G11C 11/40* (2006.01)
 *G11C 11/402* (2006.01)
(Continued)

(52) U.S. Cl.
 CPC .......... *G11C 11/4023* (2013.01); *G11C 5/025* (2013.01); *G11C 7/1006* (2013.01);
(Continued)

(58) Field of Classification Search
 CPC . G11C 11/4023; G11C 11/407; G11C 7/1006; G11C 5/025; G11C 11/406; G11C 11/403; G11C 2211/4068
 See application file for complete search history.

(56) References Cited

U.S. PATENT DOCUMENTS 4,380,046 A    4/1983 Fung
4,435,792 A    3/1984 Bechtolsheim
(Continued)

FOREIGN PATENT DOCUMENTS

CN    102141905    8/2011
EP    0214718    3/1987
(Continued)

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing—Issues in embedded single-chip multicore architectures.
(Continued)

*Primary Examiner* — Ajay Ojha
(74) *Attorney, Agent, or Firm* — Brooks, Cameron & Huebsch, PLLC (57) ABSTRACT

The present disclosure includes apparatuses and methods related to compute components formed over an array of storage elements. An example apparatus comprises a base substrate material and an array of memory cells formed over the base substrate material. The array can include a plurality of access transistors comprising a first semiconductor material. A compute component can be formed over and coupled to the array. The compute component can include a plurality of compute transistors comprising a second semiconductor material. The second semiconductor material can have a higher concentration of doping ions than the first semiconductor material.

17 Claims, 6 Drawing Sheets

Related U.S. Application Data continuation of application No. 15/806,123, filed on Nov. 7, 2017, now Pat. No. 10,373,666.

(60) Provisional application No. 62/419,004, filed on Nov. 8, 2016.

(51) Int. Cl.

| | | |
|---|---|---|
| *G11C 11/406* | (2006.01) | |
| *G11C 11/403* | (2006.01) | |
| *G11C 5/02* | (2006.01) | |
| *G11C 7/10* | (2006.01) | |
| *G11C 11/407* | (2006.01) | |

(52) U.S. Cl.
CPC .......... *G11C 11/402* (2013.01); *G11C 11/403* (2013.01); *G11C 11/406* (2013.01); *G11C 11/407* (2013.01); *G11C 2211/4068* (2013.01)

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |

(56) References Cited

U.S. PATENT DOCUMENTS

| | | |
|---|---|---|
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0035548 A1 | 11/2001 | Wahlstrom |
| 2001/0043089 A1 | 11/2001 | Forbes et al. |
| 2002/0050634 A1 | 5/2002 | Han |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0128189 A1 | 5/2009 | Madurawe et al. |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |

(56) References Cited

U.S. PATENT DOCUMENTS

| | | |
|---|---|---|
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0225422 A1 | 8/2016 | Tiwari et al. |
| 2016/0266873 A1 | 9/2016 | Tiwari et al. |
| 2016/0266899 A1 | 9/2016 | Tiwari |
| 2016/0267951 A1 | 9/2016 | Tiwari |
| 2016/0292080 A1 | 10/2016 | Leidel et al. |
| 2016/0306584 A1 | 10/2016 | Zawodny et al. |
| 2016/0306614 A1 | 10/2016 | Leidel et al. |
| 2016/0365129 A1 | 12/2016 | Willcock |
| 2016/0371033 A1 | 12/2016 | La Fratta et al. |
| 2017/0052906 A1 | 2/2017 | Lea |
| 2017/0178701 A1 | 6/2017 | Willcock et al. |
| 2017/0192844 A1 | 7/2017 | Lea et al. |
| 2017/0228192 A1 | 8/2017 | Willcock et al. |
| 2017/0235515 A1 | 8/2017 | Lea et al. |
| 2017/0236564 A1 | 8/2017 | Zawodny et al. |
| 2017/0242902 A1 | 8/2017 | Crawford et al. |
| 2017/0243623 A1 | 8/2017 | Kirsch et al. |
| 2017/0262369 A1 | 9/2017 | Murphy |
| 2017/0263306 A1 | 9/2017 | Murphy |
| 2017/0269865 A1 | 9/2017 | Willcock et al. |
| 2017/0269903 A1 | 9/2017 | Tiwari |
| 2017/0277433 A1 | 9/2017 | Willcock |
| 2017/0277440 A1 | 9/2017 | Willcock |
| 2017/0277581 A1 | 9/2017 | Lea et al. |
| 2017/0277637 A1 | 9/2017 | Willcock et al. |
| 2017/0278559 A1 | 9/2017 | Hush |
| 2017/0278584 A1 | 9/2017 | Rosti |
| 2017/0285988 A1 | 10/2017 | Dobelstein |
| 2017/0293434 A1 | 10/2017 | Tiwari |
| 2017/0301379 A1 | 10/2017 | Hush |
| 2017/0309314 A1 | 10/2017 | Zawodny et al. |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Kogge, et al., "Processing In Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

TABLE 6-1

| A | B | NOT OPEN | OPEN TRUE | OPEN INVERT |
|---|---|---|---|---|
| 0 | 0 | 0 | 0 | 1 |
| 0 | 1 | 0 | 1 | 0 |
| 1 | 0 | 1 | 0 | 1 |
| 1 | 1 | 1 | 1 | 0 |

671, 673, 675, 677, 679, 681

TABLE 6-2

| | | | | | | | | | | | |
|---|---|---|---|---|---|---|---|---|---|---|---|
| | FF | 0 | 0 | 0 | 0 | 0 | 0 | 1 | 1 | 1 | ← 684 |
| | FT | 0 | 0 | 0 | 1 | 1 | 1 | 0 | 0 | 0 | ← 685 |
| | TF | 0 | 0 | 1 | 0 | 0 | 1 | 0 | 0 | 1 | ← 686 |
| | TT | 0 | 1 | 0 | 0 | 1 | 0 | 0 | 1 | 0 | ← 687 |
| A | B | A | A*B | A*$\bar{B}$ | A+B | B | AXB | A+$\bar{B}$ | $\overline{AXB}$ | $\bar{B}$ | ← 688 |
| 0 | 0 | 0 | 0 | 0 | 0 | 0 | 0 | 1 | 1 | 1 | |
| 0 | 1 | 0 | 0 | 0 | 1 | 1 | 1 | 0 | 0 | 0 | |
| 1 | 0 | 1 | 0 | 1 | 1 | 0 | 1 | 1 | 0 | 1 | |
| 1 | 1 | 1 | 1 | 0 | 1 | 1 | 0 | 1 | 1 | 0 | |

APPARATUSES AND METHODS FOR COMPUTE COMPONENTS FORMED OVER AN ARRAY OF MEMORY CELLS

PRIORITY INFORMATION

This application is a Continuation of U.S. application Ser. No. 16/526,198, filed on Jul. 30, 2019, which issues as U.S. Pat. No. 10,854,269 on Dec. 1, 2020, which is a Continuation of U.S. application Ser. No. 15/806,123, filed Nov. 7, 2017, which issued as U.S. Pat. No. 10,373,666 on Aug. 6, 2019, which claims the benefit of U.S. Provisional Application No. 62/419,004, filed Nov. 8, 2016, the contents of which are included herein by reference.

TECHNICAL FIELD

The present disclosure relates generally to semiconductor memory and methods, and more particularly, to apparatuses and methods related to compute components formed over an array of memory cells.

BACKGROUND

Memory devices are typically provided as internal, semiconductor, integrated circuits in computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processing resource can comprise a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of logical operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and data may also be sequenced and/or buffered.

In many instances, the processing resources (e.g., processor and/or associated functional unit circuitry) may be external to the memory array, and data is accessed via a bus between the processing resources and the memory array to execute a set of instructions. Processing performance may be improved in an in-memory intelligence (IMI) device, which can also be referred to as a processing-in-memory (PIM) device, in which a processing resource may be implemented internal and/or near to a memory (e.g., directly on a same chip as the memory array). An IMI device may reduce time in processing and may also conserve power. Data movement between and within arrays and/or subarrays of various memory devices, such as IMI devices, can affect processing time and/or power consumption.

DETAILED DESCRIPTION

The present disclosure includes apparatuses and methods related to compute components formed over an array of memory cells. An example apparatus comprises a base substrate material and an array of memory cells formed over the base substrate material. The array can include a plurality of access transistors comprising a first semiconductor material. The compute component can be formed over and coupled to the array. The compute component can include a plurality of compute transistors comprising a second semiconductor material. Sensing circuitry can be formed over and coupled to the array, wherein the sensing circuitry comprises the compute component and a sense amplifier coupled to the compute component. The second semiconductor material can have a higher concentration of doping ions than the first semiconductor material. The second semiconductor material having a higher concentration of doping ions than the first semiconductor material can be done as part of optimizing leakage characteristics of transistors, such as access transistors, for a low leakage current.

In some approaches, memory devices may comprise an array of memory cells formed on a base substrate material. A memory device may be formed from the bottom up, starting with the base substrate material. Access transistors and sensing circuitry may be formed in the base substrate material. However, forming the array of memory cells may require several heating cycles. These heating cycles affect the concentration of doping ions in semiconductor components formed prior to the heating cycles by lowering the concentration of doping ions.

Doping ions in a semiconductor material formed prior to the heating cycles needed to form a storage element (e.g., a memory cell) can move during the heating cycles such that the ions disperse in the substrate, forming leakage paths. Thus, a semiconductor component that was heavily doped so as to have a high concentration of doping ions may end up having significant leakage paths as a result of the subsequent heating cycles. While, a lower concentration of doping ions may result in slower transistors as a function of increased resistance, it also may result in lower leakage currents. Lower leakage currents for access transistors (e.g., DRAM access transistors) may enhance DRAM data retention time. These lower leakage currents can help preserve charge stored in a storage element coupled to an access transistor from leaking array from the storage element. If charge leaks out then a data value stored in the storage element can changed over time. Consequently, it can be beneficial to have the base substrate material and the access transistors of a memory device to have a low concentration of doping ions. Therefore, access transistors that are formed in the base substrate material can be formed having an initial low concentration of doping ions.

An IMI device can comprise a compute component, which can comprise a plurality of compute transistors used in performing computations on data stored in the array. The compute component can benefit from being formed of a semiconductor material having a higher concentration of doping ions. Doping a semiconductor material to a high concentration of doping ions causes the semiconductor material to become a better conductor of electricity. As a better conductor of electricity, transistors formed in the material having a high concentration of doping ions can switch faster and have shorter switching times than the other semiconductor components, such as access transistors formed in a semiconductor material having a low concentration of doping ions.

Because the compute component can comprise transistors (e.g., a plurality of compute transistors) used to perform computations, via performing logic operations, it can be beneficial to form transistors of the compute component having a high concentration of doping ions. A semiconductor material having a high concentration of doping ions can have a high leakage current. If components other than the compute component, such as access transistors, have a high leakage current, then the memory cell retention time for those components can be shortened. As used herein, "memory cell retention time" refers to the time which a memory cell is able to hold a charge, which can correspond to data, such that when the memory cell is read (e.g., by a sense amplifier) the data is interpreted correctly. Because transistors of the compute component are not used for data storage, a higher leakage current is not problematic, but rather beneficial because of the shorter switching times. In an IMI device that includes an array of storage elements where the storage elements formed over each other (e.g., layered), the heating cycles can compound the dispersal of doping ions of semiconductor components formed before the storage elements, further exasperating the tradeoffs between fast switching transistors for logic transistors and low-leaking transistors for storage (e.g., DRAM storage).

At least one embodiment of the present disclosure can include a memory device being a multi-layer memory device. In a multi-layer memory device where multiple semiconductor materials are formed on top of each other (e.g., a layered formation), semiconductor materials formed before (e.g., lower layers) other semiconductor materials (e.g., upper layers) can be subjected to more heating cycles than the other semiconductor materials (e.g., the upper layers). A lowered concentration of doping may negatively affect the performance of the compute transistors, and consequently the performance of the IMI device. Thus, it can be beneficial to form semiconductor materials having a high concentration of doping ions after forming the lower layers (e.g., as an uppermost layer(s)) such that the high concentration of doping ions in the uppermost layer(s) can be maintained. Thus, it can be beneficial to form the compute component after an array of storage elements has been formed.

By forming compute circuitry in a semiconductor material formed over an array of storage elements, the compute component in the semiconductor material is not subjected to the heating cycles from forming the array of storage elements. Thus, a greater level of control of the concentration of doping ions in the semiconductor material can be achieved such that the concentration of doping ions of the semiconductor material can be maintained.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "n", particularly with respect to reference numerals in the drawings, indicate that a number of the particular feature so designated can be included. As used herein, "a number of" a particular thing refers to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 215 may reference element "15" in FIG. 2, and a similar element may be referenced as 315 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

Figure 1:
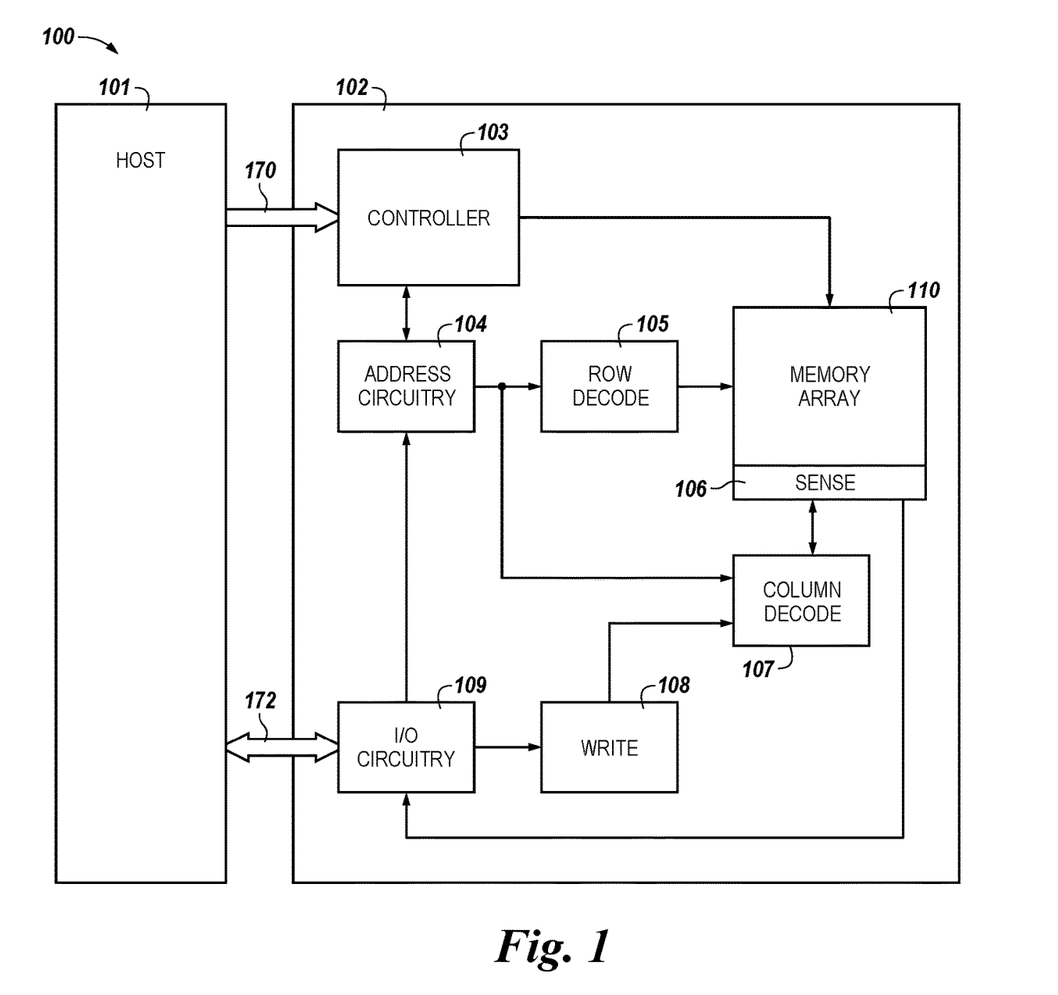
FIG. 1 is a block diagram of an apparatus in the form of a computing system including a memory device in accordance with a number of embodiments of the present disclosure.

FIG. 1 is a block diagram of an apparatus in the form of a computing system 100 including a memory device 102 in accordance with a number of embodiments of the present disclosure. As used herein, a memory device 102, a controller 103, a memory array 110, and/or sensing circuitry 106 might also be separately considered an "apparatus."

The system 100 includes a host 101 coupled (e.g., connected) to the memory device 102, which includes a memory array 110. The host 101 can be a host system such as a personal laptop computer, a desktop computer, a digital camera, a smart phone, or a memory card reader, among various other types of hosts. The host 101 can include a system motherboard and/or backplane and can include a number of processing resources (e.g., one or more processors, microprocessors, or some other type of controlling circuitry). The system 100 can include separate integrated circuits or both the host 101 and the memory device 102 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 110 can be a hybrid memory cube (HMC), computational memory such as a processing-in-memory random access memory (PIMRAM) array, which can include one or more of a DRAM array, SRAM array, STT RAM array, PCRAM array, TRAM array, RRAM array, NAND flash array, and/or NOR flash array, for instance. The memory array 110 can comprise memory cells arranged in rows coupled by access lines, which may be referred to herein as word lines or select lines, and columns coupled by digit lines, which may be referred to herein as bit lines, data lines, or sense lines. Although a single memory array 110 is shown in FIG. 1, embodiments are not so limited. For instance, the memory device 102 may include a number of memory arrays 110 (e.g., a number of banks of DRAM cells, NAND flash cells, etc.).

The memory device 102 can include address circuitry 104 to latch address signals for data provided over an input/output "I/O" bus 172 (e.g., data bus and/or address bus) through I/O circuitry 109 (e.g., provided to external ALU circuitry and to DRAM DQs via local I/O lines and global I/O lines). Address signals are received through address circuitry 104 and decoded by a row decoder 105 and a column decoder 107 to access the memory array 110. Data can be read from the memory array 110 by sensing voltage and/or current changes on the digit lines using the sensing circuitry 106. The sensing circuitry 106 can read and latch a page (e.g., row) of data from the memory array 110. The I/O circuitry 109 can be used for bi-directional data communication with the host 101 over the I/O bus 172. In a number of embodiments, sensing circuitry 106 can include a number of sense amplifiers and a respective number of compute components as will be discussed further herein. The write circuitry 108 can be used to write data to the memory array 110.

The controller 103 (e.g., memory controller) decodes signals provided by the control bus 170 from the host 101. These signals can include chip enable signals, write enable signals, and address latch signals that are used to control operations performed on the memory array 110, including data read, data write, and data erase operations. In various embodiments, the controller 103 is responsible for executing instructions from the host 101 and sequencing access to the memory array 110. The controller 103 can be a state machine, sequencer, or some other type of controller, and include hardware and/or firmware (e.g., microcode instructions) in the form of an application specific integrated circuit (ASIC). The controller 103 can control, for example, generation of clock signals and application of the clock signals to a compute component in sensing circuitry in association with shifting data in accordance with embodiments described herein.

In a number of embodiments, the sensing circuitry 106 can comprise a sense amplifier and a compute component. The compute component may also be referred to herein as an accumulator, and can be used to perform logical operations (e.g., on data associated with a pair of complementary digit lines). The compute component can comprise a plurality of transistors, which can be referred to as compute transistors. According to various embodiments, the compute component comprises a first storage location and a second storage location. The first and second storage locations of the sensing components can serve as stages of a shift register. For example, clock signals can be applied to the sensing components to move data values between the first and second storage locations and to shift data between adjacent sensing components.

In a number of embodiments, the sensing circuitry 106 can be used to perform logical operations using data stored in the memory array 110 as inputs and/or store the results of the logical operations back to the memory array 110 without transferring data via a digit line address access (e.g., without firing a column decode signal). As such, various compute functions can be performed using, and within, the sensing circuitry 106 rather than (or in association with) being performed by processing resources external to the sensing circuitry 106 (e.g., by a processing resource associated with the host 101 and/or other processing circuitry, such as ALU circuitry, located on device 102 (e.g., on the controller 103 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, the sensing circuitry 106 is configured to perform logical operations on data stored in the memory array 110 and store the result back to the memory array 110 without enabling an I/O line (e.g., a local I/O line) coupled to the sensing circuitry 106.

As such, in a number of embodiments, circuitry external to the memory array 110 and sensing circuitry 106 is not needed to perform compute functions as the sensing circuitry 106 can perform the appropriate logical operations to perform such compute functions without the use of an external processing resource. Therefore, the sensing circuitry 106 may be used to complement and/or to replace, at least to some extent, such an external processing resource (or at least the bandwidth consumption of such an external processing resource).

However, in a number of embodiments, the sensing circuitry 106 may be used to perform logical operations (e.g., to execute instructions) in addition to logical operations performed by an external processing resource (e.g., the host 101). For instance, the host 101 and/or sensing circuitry 106 may be limited to performing only certain logical operations and/or a certain number of logical operations.

In a number of embodiments, the sensing circuitry 106 can be formed on a same pitch as a pair of complementary sense lines of the array. For example, the cells of a memory array may have a $4F^2$ or $6F^2$ cell size, where "F" is a feature size corresponding to the cells. As an example, a pair of complementary memory cells may have a cell size with a 6F² pitch (e.g., 3F×2F). If the pitch of a pair of complementary sense lines for the complementary memory cells is 3F, then the sensing circuitry being on pitch indicates the sensing circuitry (e.g., a sense amplifier and corresponding compute component per respective pair of complementary sense lines) is formed to fit within the 3F pitch of the complementary sense lines.

Enabling an I/O line can include enabling (e.g., turning on) a transistor having a gate coupled to a decode signal (e.g., a column decode signal) and a source/drain coupled to the I/O line. However, embodiments are not limited to performing logical operations using sensing circuitry (e.g., the sensing circuitry 106) without enabling column decode lines of the memory array 110. Whether or not local I/O lines are used in association with performing logical operations via sensing circuitry 106, the local I/O line(s) may be enabled in order to transfer a result to a suitable location other than back to the memory array 110 (e.g., to an external register).

Figure 2:
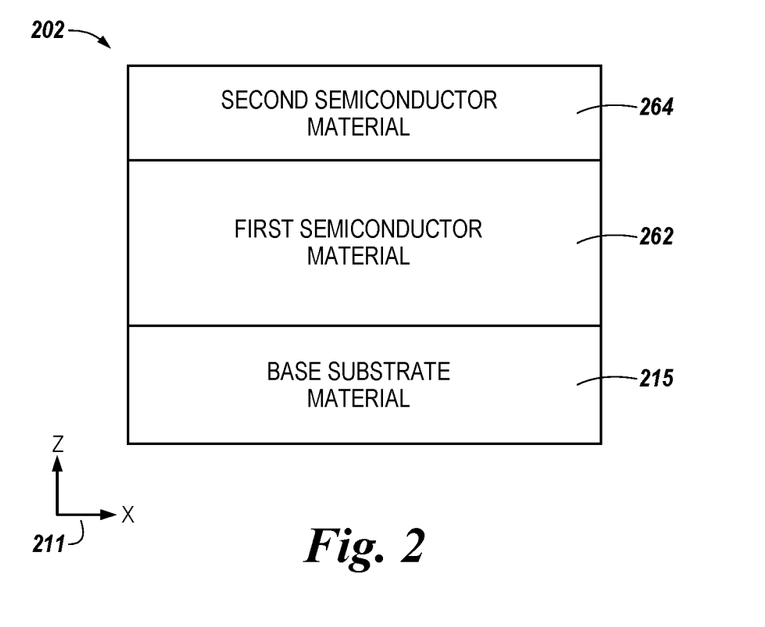
FIG. 2 is a block diagram illustrating a cross-sectional view of a portion of a memory device in accordance with a number of embodiments of the present disclosure.

FIG. 2 is a block diagram illustrating a cross-sectional view of a portion of a memory device 202 in accordance with a number of embodiments of the present disclosure. For illustration purposes only, a set of axes 211 are used to show the orientation of a cross-sectional view of the portion of a multi-layer memory device 202. The x-direction follows the width of the page and the z-direction follows the length of the page. The y-direction (not shown) is into and out of the page. The memory device 202 can be analogous to the memory device 102 illustrated in FIG. 1. In the embodiment of FIG. 2, the memory device 202 is a multi-layer memory device. The memory device 202 can comprise a base substrate material 215, a first semiconductor material 262 formed over the base substrate material 215, and a second semiconductor material 264 formed over the first semiconductor material 262. The base substrate material 215 can be a monocrystalline silicon base substrate. The first semiconductor material 262 can be an amorphous silicon first semiconductor material. The second semiconductor material 264 can be an amorphous silicon second semiconductor material. Although FIG. 2 shows two semiconductor materials, the first semiconductor material 262 and the second semiconductor material 264, any number of semiconductor materials can be formed over the base substrate material 215. For example, a third semiconductor material (not shown) can be formed over the second semiconductor material 264, a fourth semiconductor material (not shown) can be formed over the third semiconductor material, and so on.

Figure 3:
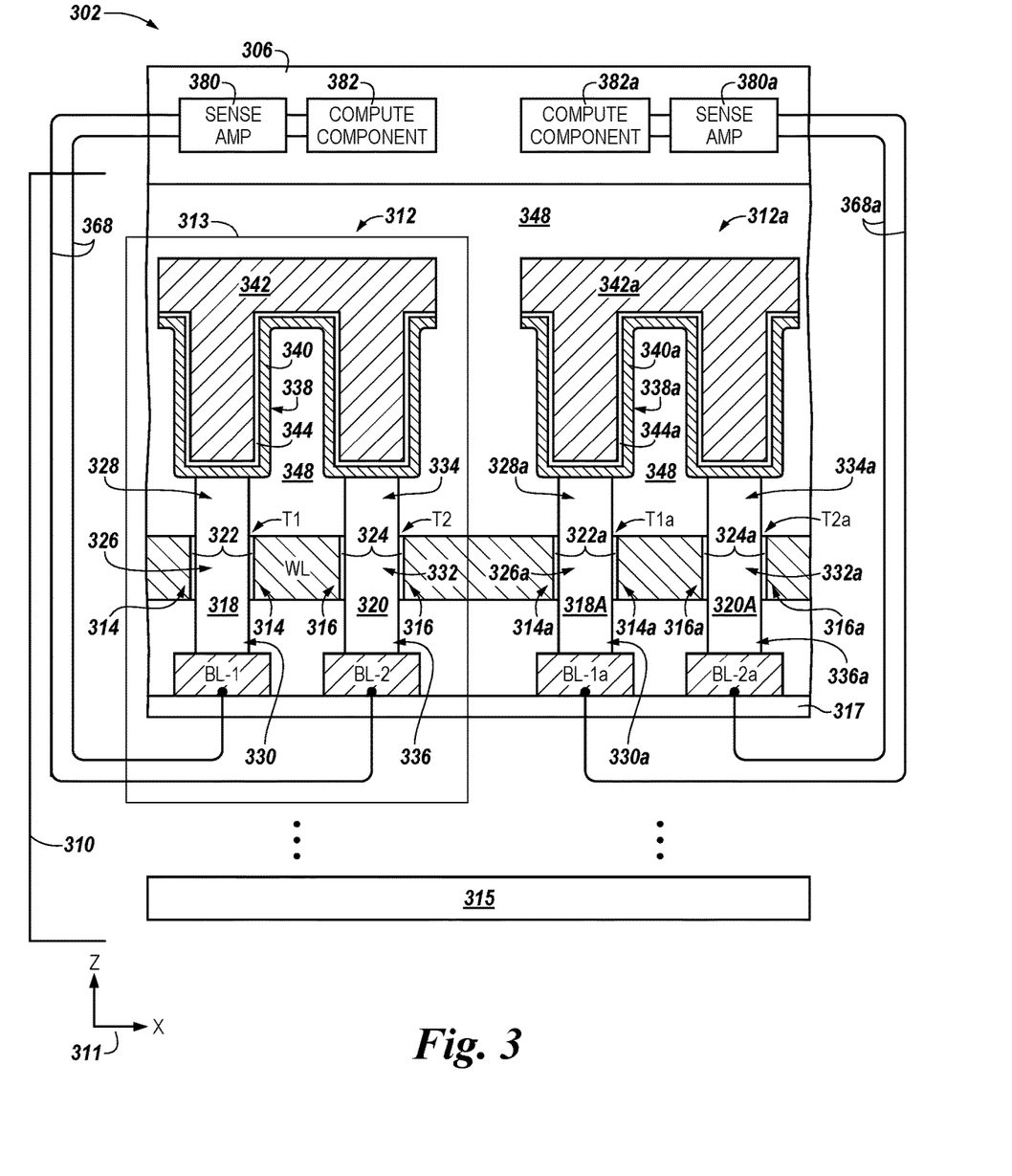
FIG. 3 is a schematic diagram illustrating a cross-sectional view of a portion of a memory device in accordance with a number of embodiments of the present disclosure.
Figure 4:
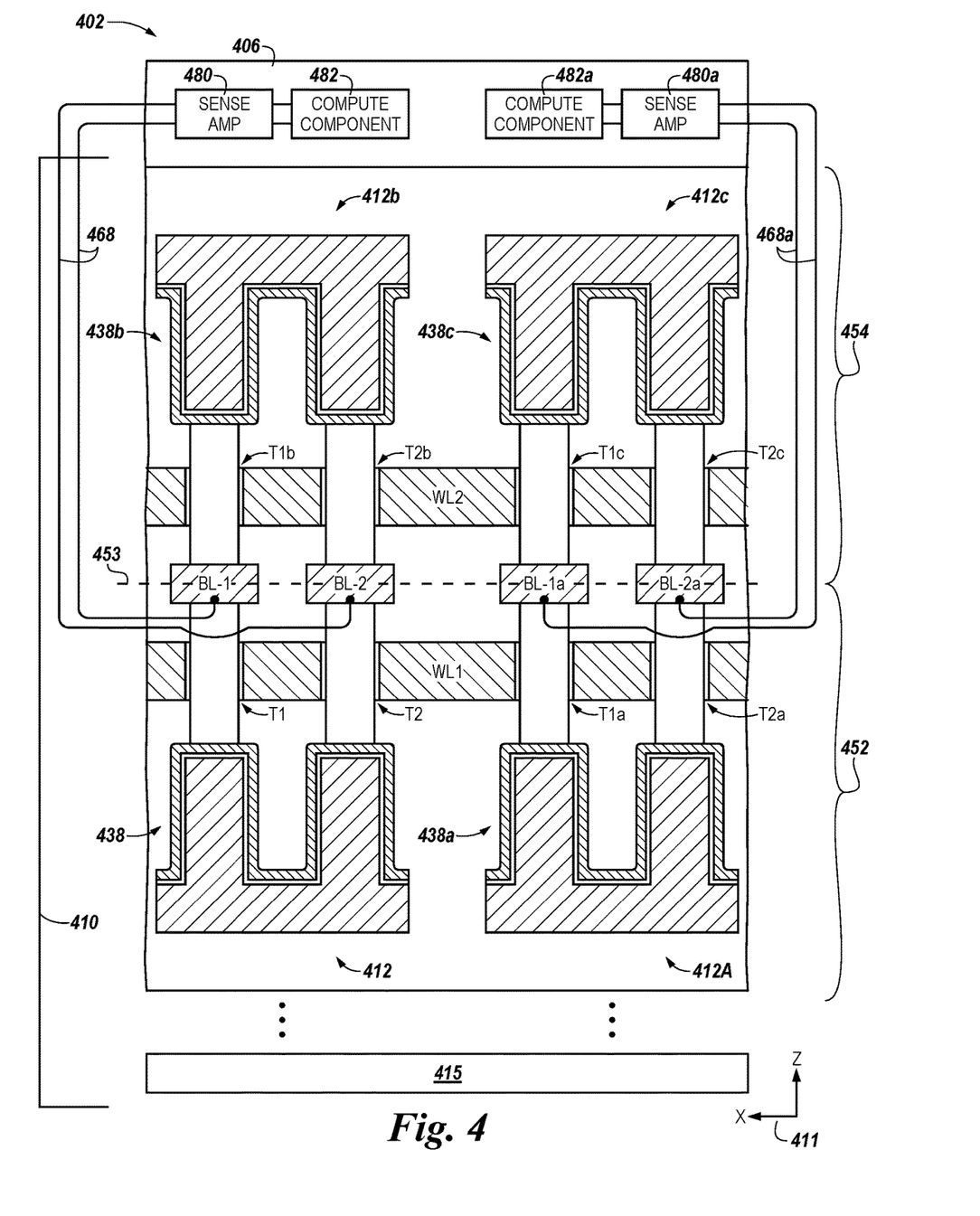
FIG. 4 is a schematic diagram illustrating a cross-sectional view of a portion of a memory device comprising layered memory tiers in accordance with a number of embodiments of the present disclosure.

A plurality of access transistors can be formed in the base substrate material 215 or formed over the base substrate material 215 such that the plurality of access transistors comprises the first semiconductor material 262. The plurality of access transistors can be coupled to an array of storage elements formed over the base substrate material 215. In at least one embodiment in accordance with the present disclosure, the array of storage elements can include the plurality of access transistors directly coupled to the storage elements such that the storage elements and the plurality of access transistors together comprise an array of memory cells (e.g., a DRAM array). Examples of arrays of memory cells in accordance with the present disclosure are illustrated in FIGS. 3 and 4.

A compute component (not shown), which can comprise a plurality of compute transistors, can be formed over the array of storage elements such that the plurality of compute transistors comprises the second semiconductor material 264. The memory device 202 can comprise a plurality of metal interconnects (not shown) that interconnects, the plurality of access transistors, the array of storage elements, and the compute component.

In at least one embodiment in accordance with the present disclosure, a first portion of the sensing circuitry (e.g., a sense amplifier) can be formed in the base substrate material 215 and a second portion of the sensing circuitry (e.g., at least a portion of the compute component) can be formed over the array of storage elements. For example, a plurality of sense amplifiers can be formed in the base substrate material 215 as part of the first portion of the sensing circuitry and a plurality of compute transistors of the compute component comprising the second semiconductor material 264 can be formed over the array of storage elements as part of the second portion of the sensing circuitry.

The second semiconductor material 264 can be doped to a higher doping concentration than the first semiconductor material 262 or the base substrate material 215. A higher concentration of doping ions can decrease the leakage current. As discussed above, high leakage currents can hinder the performance of a memory array because memory cell retention times can be diminished. However, a lower concentration of doping ions can correspond to shorter refresh intervals. For example, compute transistors formed of the second semiconductor material 264 having a low concentration of doping ions can have shorter refresh intervals than access transistors formed of the first semiconductor material 262 or the base substrate material 215 having a high concentration of doping ions. Faster switching can be a function of a shorter refresh cycle time. Access transistors having short refresh intervals can be detrimental to the performance of a memory array.

FIG. 3 is a schematic diagram illustrating a cross-sectional view of a portion of a memory device 302 in accordance with a number of embodiments of the present disclosure. For illustration purposes only, a set of axes 311 are used to show the orientation of a cross-sectional view of the memory array 310. The x-direction follows the width of the page and the z-direction follows the length of the page. The y-direction (not shown) is into and out of the page. The memory device 302 can be analogous to the memory device 102 illustrated in FIG. 1. The memory array 310 can be analogous to the memory array 110 illustrated in FIG. 1. The base substrate material 315 can be analogous to the base substrate material 215 illustrated in FIG. 2.

FIG. 3 illustrates a portion of an array of memory cells comprising two transistor-one capacitor (2T-1C) memory cells. Specifically, a pair of adjacent memory cells 312 and 312a are illustrated. A box 313 demarcates an approximate boundary of the memory cell 312. The memory cells 312 and 312a can be substantially identical to one another, with the term "substantially identical" meaning that the memory cells are identical to within reasonable tolerances of fabrication and measurement.

The illustrated portion of the array of memory cells is supported by a base substrate material 315. The base substrate material 315 can comprise a semiconductor material; and can, for example, comprise, consist essentially of, or consist of monocrystalline silicon. The base substrate material 315 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, the base substrate material 315 can correspond to a semiconductor substrate containing one or more materials associated with integrated circuit fabrication. Such materials can include, for example, one or more of refractory metal materials, barrier materials, diffusion materials, insulator materials, etc.

The base substrate material 315 is shown to be spaced from components of the memory array 310 to indicate that other circuitry or components may be between the memory cells 312 and 312a and the base substrate material 315. For example, additional pairs of memory cells 312 and 312a can be formed between the memory cells 312 and 312a illustrated in FIG. 3 and the base substrate material 315. Although FIG. 3 illustrates sensing circuitry 306, which can be analogous to the sensing circuitry 106 illustrated in FIG. 1, being located above the memory array 310, a portion of the sensing circuitry 306 can be formed between the memory cells 312 and 312a and the base substrate material 315. For example, sense amplifiers 380 and 380a of the sensing circuitry 306 can be formed in the base substrate material 315 such that the compute components 382 and 382a without sense amplifiers 380 and 380a are located above the memory array 310. Although FIG. 3 illustrates the compute components 382 and 382a being located above the memory array 310, a portion of the compute components 382 and 382a (e.g., the latch 591 illustrated in FIG. 5) can be formed between the memory cells 312 and 312a and the base substrate material 315. An interlayer insulating film 317 can intervene between the base substrate material 315 and the memory array 310. The insulating film 317 can comprise any suitable electrically insulative material or combination of insulative materials, including, for example, silicon dioxide, silicon nitride, etc.

In the illustrated embodiment, the insulating film 317 has a substantially planar upper surface, and the comparative digit lines (e.g., bit lines (BL)) BL-1, BL-2, BL-1a and BL-2a are disposed on such upper surface, and in parallel with one another. The term "substantially planar" means planar to within reasonable tolerances of fabrication and measurement.

The memory cell 312 comprises a pair of complementary digit lines BL-1 and BL-2, and comprises transistors T1 and T2 over the digit lines BL-1 and BL-2, respectively. Similarly the memory cell 312a comprises a pair of complementary digit lines BL-1a and BL-2a, and comprises transistors T1a and T2a. The pair of complementary digit lines BL-1 and BL-2 can be coupled to sensing circuitry 306. The sensing circuitry 306 can be formed over the memory cells 312 and 312a. Similarly, the pair of complementary digit lines BL-1a and BL-2a can be coupled to the sensing circuitry 306.

As illustrated in FIG. 3, the complementary pair of digit lines BL-1 and BL-2 of memory cell 312 are laterally displaced relative to one another, and similarly the transistors T1 and T2 are laterally displaced relative to one another. The transistors T1 and T2 are shown to be in a common horizontal plane as one another (i.e., are horizontally aligned with one another), but in other embodiments can be vertically offset relative to one another.

The transistors T1 and T2 comprise gates 314 and 316; and similarly the transistors T1a and T2a comprise gates 314a and 316a. The memory cells 312 and 312a are in a common row as one another within the memory array, and accordingly a word line (WL) extends across all of the transistors T1, T1a, T2 and T2a, and comprises the gates of the transistors. The word line and the digit lines can comprise any suitable electrically conductive material, including, for example, one or more of various metals (e.g., tungsten, titanium, etc.), metal containing compositions (e.g., metal nitride, metal carbide, metal silicide, etc.), conductively-doped semiconductor materials (e.g., conductively-doped silicon, conductively-doped germanium, etc.), etc. The word line and digit lines may comprise the same composition as one another, or can comprise different compositions relative to one another.

Semiconductor pillars 318 and 320 extend upwardly from the complementary digit lines BL-1 and BL-2. Similarly, semiconductor pillars 318a and 320a extend upwardly from the complementary digit lines BL-1a and BL-2a. Semiconductor pillars 318, 320, 318a, and 320a can comprise any suitable semiconductor materials including, for example, one or both of silicon and germanium.

The semiconductor pillars 318, 320, 318a and 320a can comprise a first semiconductor material. The first semiconductor material can be analogous to the first semiconductor material 262 illustrated in FIG. 2. The first semiconductor material can be doped to a first concentration of doping ions. The first concentration can be such that the transistors T1, T2, T1a, and T2a have a low leakage current. A low leakage current can improve data retention because charge stored on the capacitors 338 and 338a may not leak out of the capacitors 338 and 338a through the corresponding transistors T1, T2, T1a, and T2a. The second semiconductor material, in which the compute components 382 and 382a or the sensing circuitry 306 can be formed, can be doped to a second concentration of doping ions. The second concentration can be higher, or lower, than the first concentration.

The transistor gate 314 is spaced from the semiconductor pillar 318 by a gate dielectric material 322, and the transistor gate 316 is spaced from the semiconductor pillar 320 by a gate dielectric material 324. The gate dielectric materials 322 and 324 can comprise any suitable compositions or combinations of compositions, including, for example, silicon dioxide, silicon nitride, high-K dielectric material, ferroelectric material, etc. The gate dielectric materials 322a and 324a within the transistors T1a and T2a can be analogous to the gate dielectric materials 322 and 324.

The transistor T1 comprises a channel region 326 within the semiconductor pillar 318, and comprises source/drain regions 328 and 330 on opposing sides of the channel region. The source/drain regions 328 and 330 and the channel region 326 can be doped with any suitable doping ions. In some embodiments, the source/drain regions 328 and 330 can be n-type majority doped, and in other embodiments may be p-type majority doped.

The transistor T2 comprises a channel region 332 within the semiconductor pillar 320, and comprises source/drain regions 334 and 336 on opposing sides of the channel region 332. In some embodiments, the source/drain regions 334 and 336 may be n-type majority doped, and in other embodiments can be p-type majority doped. In some embodiments, the source/drain regions 328 and 330 can be referred to as first and second source/drain regions, respectively; and the source/drain regions 334 and 336 can be referred to as third and fourth source/drain regions, respectively.

The transistors T1a and T2a comprise source/drain regions 328a, 330a, 334a, and 336a and channel regions 326a and 332a, which can be analogous those described with reference to the transistors T1 and T2.

As shown in FIG. 3, sensing circuitry 306 can comprise a sense amplifier 380 coupled to the pair of complementary digit lines BL-1 and BL-2 via metal interconnects 368 and a sense amplifier 380a coupled to the pair of complementary digit lines BL-1a and BL-2a via metal interconnects 368a. The sense amplifiers 380 and 380a can be coupled to compute components 382 and 382a, respectively. The compute components 382 and 382a can be a discrete collection of elements. For example, the compute components 382 and 382a can comprise a plurality of compute transistors (which can be referred to as "Boolean logic"), an accumulator storage location, and a shift storage location. The plurality of compute transistors can comprise a second semiconductor material. The second semiconductor material can be analogous to the second semiconductor material 264 illustrated in FIG. 2. The second semiconductor material can be doped to a second concentration of doping ions. Although not illustrated in FIG. 3, the compute components 382 and 382a can include selectable logical operation selection logic.

In some embodiments, the compute components 382 and 382a can be coupled to another compute component such that data values (e.g., bits) can be moved (e.g., shifted) from one compute component to another compute component. Shifting data values between one compute component and another compute component may be done synchronously such that a compute component receives a data value from another compute component as the compute component passes its data value to yet another compute component. In some embodiments, shifting data in the compute components 382 and 382a can facilitate various processing functions such as the multiplication, addition, etc. of two operands.

The memory cell 312 comprises a capacitor 338 which is vertically displaced relative to transistors T1 and T2, and as illustrated in FIG. 3, is over the transistors T1 and T2. The capacitor 338 can be a storage element. The capacitor 338 comprises an outer node (or first node) 340, an inner node (or second node) 342, and a capacitor dielectric material 344 between the outer and inner nodes 340 and 342. In the embodiment of FIG. 3 the outer node 340 is container-shaped, and the inner node 342 and the capacitor dielectric material 344 extend into the container-shaped outer node 340. In some embodiments, the outer node 340 can have a different configuration (e.g., a planar configuration).

The outer and inner nodes 340 and 342 can comprise any suitable electrically conductive compositions or combinations of electrically conductive compositions, including, for example, one or more of various metals (e.g., tungsten, titanium, etc.), metal containing materials (for instance, metal nitride, metal silicide, metal carbide, etc.), conductively-doped semiconductor materials (for instance, conductively-doped silicon, conductively-doped germanium, etc.), etc. The outer and inner nodes 340 and 342 can comprise the same composition as one another in some embodiments, and in other embodiments can comprise different compositions relative to one another.

The capacitor dielectric material 344 can comprise any suitable composition or combination of compositions. In some embodiments, the capacitor dielectric material may comprise non-ferroelectric material and may, for example, consist of one or more of silicon dioxide, silicon nitride, aluminum oxide, hafnium oxide, zirconium oxide, etc. In some embodiments the capacitor dielectric material may comprise ferroelectric material. For instance, the capacitor dielectric material may comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, niobium, strontium, and a rare earth element.

As illustrated in FIG. 3, the outer electrode 340 is electrically coupled with the first source/drain region 328 of transistor T1, and the inner electrode 342 is electrically coupled with the third source/drain region 334 of transistor T2. The second source/drain region 330 of transistor T1 is electrically coupled with complementary digit line BL-1 and the fourth source/drain region 336 of transistor T2 is electrically coupled with complementary digit line BL-2. The capacitor 338, together with transistors T1 and T2, and complementary digit lines BL-1 and BL-2, forms a 2T-1C memory cell. The inner electrode 342 is shown having a single homogenous composition that extends from inside of the container-shaped outer electrode 340 to outside of the container-shaped outer electrode 340 and into electrical contact with the source/drain region 334. In some embodiments, at least some of the illustrated portion of the inner electrode 342 outside of the container-shaped outer electrode 340 can be replaced with an electrically conductive interconnect which may or may not have a same composition as the inner electrode 342.

The memory cell 312a comprises a capacitor 338a, which can be analogous to the capacitor 338 of the memory cell 312 (with the capacitor 338a comprising a first node 340a, a second node 342a, and a capacitor dielectric material 344a), and also comprises a 2T-1C memory cell.

An insulative material 348 is shown to surround the various components of memory cells 312 and 312a. Such insulative material may comprise any suitable composition or combination of compositions; including, for example, one or more of silicon dioxide, silicon nitride, borophosphosilicate glass, spin-on dielectric, etc. Although the insulative material 348 is shown as a single homogeneous material, in other embodiments the insulative material may include two or more discrete insulative compositions.

Although not illustrated in FIG. 3, the embodiment illustrated in FIG. 3 can include global metal interconnects and pads directly coupled to the sensing circuitry 306. A benefit of having the global metal interconnects and pads directly coupled to the sensing circuitry 306 can be reduced resistive and capacitive loads on the interface between the memory array 310 and other devices or components coupled to the memory array 310 (e.g., transmitting data to and from the memory array 310). The reduction of the resistive and capacitive loads can be a result of the shorter distance between the sensing circuitry and the global metal interconnects and pads.

A controller, such as the controller 103 illustrated in FIG. 1, can be coupled to the memory array 310 and the sensing circuitry 306, for example, via the global metal interconnects and pads (not shown). Although not illustrated in FIG. 3, in an embodiment where sense amplifiers 380 and 380a are located elsewhere in the memory device 302, such as being formed in the base substrate material 315, the controller can be, for example, coupled to the memory array 310 and the compute components 382 and 382a via the global metal interconnects and pads (not shown) and to the sense amplifiers 380 and 380a via the metal interconnects 368 and 368a. The controller can be configured to cause data to be transmitted, via the metal interconnects 368 and 368a, between the memory cells 312 and 312a, the sensing circuitry 306, and the global metal interconnects and pads.

The controller can be directly coupled to the global metal interconnects and pads (not shown) such that the controller is formed over the uppermost semiconductor material of a multi-layer memory device. Minimizing the distance between the controller and the compute transistors can enhance the benefit of compute components comprising a semiconductor material having a lower concentration of doping ions formed over a semiconductor material having a lower concentration of doping ions.

FIG. 4 is a schematic diagram illustrating a cross-sectional view of a portion of a memory device comprising layered memory tiers 452 and 454 in accordance with a number of embodiments of the present disclosure. The memory device 402 can be analogous to the memory device 102 illustrated in FIG. 1. The memory array 410 can be analogous to the memory array 110 illustrated in FIG. 1. The base substrate material 415 can be analogous to the base substrate material 215 illustrated in FIG. 2. The sensing circuitry 406 can be analogous to the sensing circuitry 306 illustrated in FIG. 3. The sense amplifiers 480 and 480a, the compute components 482 and 482a, and the metal interconnects 468 and 468a can be analogous to the sense amplifiers 380 and 380a, the compute components 382 and 382a, and the metal interconnects 368 and 368a illustrated in FIG. 3, respectively.

FIG. 4 illustrates an array of memory cells in the form of layered memory array tiers. For illustration purposes only, a set of axes 411 are used to show the orientation of a cross-sectional view of the memory device 402. The x-direction follows the width of the page and the z-direction follows the length of the page. The y-direction (not shown) is into and out of the page. A second memory array tier 454 is formed on a first memory array tier 452. The first memory array tier 452 comprises memory cells 412 and 412a, which can be analogous the memory cells 312 and 312a illustrated in FIG. 3. The second memory array tier 454 comprises memory cells 412b and 412c that are analogous to the memory cells 412 and 412a, except that the memory cells 412b and 412c are inverted relative to the memory cells 412 and 412a. The memory cell 412b comprises first and second transistors T1b and T2b, and the memory cell 412c comprises first and second transistors T1c and T2c. The memory cells 412b and 412c comprise capacitors 438b and 438c, respectively. The word line extending across the memory cells 412 and 412a is labeled as a first word line WL1, and the word line across the memory cells 412b and 412c is labeled as a second word line WL2.

The complementary digit lines BL-1 and BL-2 can be coupled to sensing circuitry 406 formed over the memory cells 412b and 412c. Although FIG. 4 illustrates sensing circuitry 406 being located above the memory array 410, a portion of the sensing circuitry 406 can be formed between the memory cells 412 and 412a and the base substrate material 415. For example, sense amplifiers 480 and 480a of the sensing circuitry 406 can be formed in the base substrate material 415 such that the compute components 482 and 482a without sense amplifiers 480 and 480a are located above the memory array 410. Although FIG. 4 illustrates the compute components 482 and 482a being located above the memory array 410, a portion of the compute components 482 and 482a (e.g., the latch 591 illustrated in FIG. 5) can be formed between the memory cells 412, 412a, 412b, and 412c, and the base substrate material 415. The complementary digit lines BL-1a and BL-2a can be coupled to the sensing circuitry 406. As shown in FIG. 4, sensing circuitry can comprise the sense amplifier 480 coupled to the complementary digit lines BL-1 and BL-2 via metal interconnects 468 and the sense amplifier 480a coupled to the complementary digit lines BL-1a and BL-2a via metal interconnects 468a. The sense amplifiers 480 and 480a can be coupled to compute components 482 and 482a, respectively.

The compute components 482 and 482a can be a discrete collection of elements. For example, the compute components 482 and 482a can comprise a plurality of compute transistors (which can be referred to as "Boolean logic"), an accumulator storage location, and a shift storage location. The plurality of compute transistors can comprise a second semiconductor material. The second semiconductor material can be analogous to the second semiconductor material 264 illustrated in FIG. 2. The second semiconductor material can be doped to a second concentration of doping ions. As discussed above, because the plurality of compute transistors of the sensing components are formed on and after the memory cells 412, 412a, 412b, and 412c, the plurality of compute transistors can be formed with a high doping concentration corresponding to faster operation without the concern that subsequent heating cycles will cause the doping concentration to decrease.

The transistors T1, T2, T1a, T2a, T1b, T2b, T1c, and T2c can comprise a first semiconductor material. The first semiconductor material can be analogous to the first semiconductor material 262 illustrated in FIG. 2. The first semiconductor material can be doped to a first doping concentration. The first doping concentration can be such that the transistors T1, T2, T1a, T2a, T1b, T2b, T1c, and T2c have a low leakage current. A low leakage current can improve data retention because charge stored on the capacitors 438, 438a, 438b, and 438c will not leak out through the capacitors 438 and 438a corresponding the transistors T1, T2, T1a, T2a, T1b, T2b, T1c, and T2c.

The base substrate material 415 is shown to be spaced from components of the memory device 402 to indicate that other circuitry or components may be between the memory cells 412, 412a, 412b, and 412c and the base substrate material 415. For example, additional sets of memory cells 412, 412a, 412b, and 412c can be formed between the memory cells 412, 412a, 412b, and 412c illustrated in FIG. 4 and the base substrate material 415.

In some embodiments, an axis 453 through the complementary digit lines BL-1, BL-2, BL-1a, and BL-2a can be considered to define a mirror plane and the memory cells 412b and 412c may be considered to be substantially mirror images of the memory cells 412 and 412a, respectively, across the mirror plane. The term "substantially mirror images" is utilized to indicate that the indicated cells may be mirror images of one another to within reasonable tolerances of fabrication and measurement.

In some embodiments, the configuration of FIG. 3 can be considered to comprise memory cells within $4F^2$ architecture, and the configuration of FIG. 4 can be considered to comprise memory cells within $8F^2$ architecture.

Although not illustrated in FIG. 4, the embodiment illustrated in FIG. 4 can include global metal interconnects and pads directly coupled to the sensing circuitry 406. A benefit of having the global metal interconnects and pads directly coupled to the sensing circuitry 406 can be reduced resistive and capacitive loads on the interface between the memory array 410 and other components of the memory device 402 (e.g., transmitting data to and from the memory array 410). The reduction of the resistive and capacitive loads can be a result of the shorter distance between the sensing circuitry 406 and the global metal interconnects and pads. Although not illustrated in FIG. 4, the compute components 482 and 482a can include selectable logical operation selection logic A controller, such as the controller 103 illustrated in FIG. 1, can be coupled to the memory array 410 and the sensing circuitry 406, for example, via the global metal interconnects and pads (not shown). Although not illustrated in FIG.

4, in an embodiment where sense amplifiers 480 and 480*a* are located elsewhere in the memory device 402, such as being formed in the base substrate material 415, the controller can be, for example, coupled to the memory array 410 and the compute components 482 and 482*a* via the global metal interconnects and pads (not shown) and to the sense amplifiers 480 and 480*a* via the metal interconnects 468 and 468*a*. The controller can be configured to cause data to be transmitted, via the metal interconnects 468 and 468*a*, between the memory cells 412, 412*a*, 412*b*, and 412*c*, the sensing circuitry 406, and the global metal interconnects and pads.

The controller can be directly coupled to the global metal interconnects and pads (not shown) such that the controller is formed over the uppermost semiconductor material of a multi-layer memory device. Minimizing the distance between the controller and the compute transistors can enhance the benefit of compute components comprising a semiconductor material having a lower concentration of doping ions formed over a semiconductor material having a lower concentration of doping ions.

At least one embodiment in accordance with the present disclosure can include forming an array of storage elements over a base substrate material. A semiconductor material can be formed over the array of storage elements. Forming the semiconductor material can comprise forming an amorphous silicon over the array of storage elements. The semiconductor material can be doped to a particular concentration of doping ions. The semiconductor material can be doped subsequent to all heating cycles associated with forming the array of storage elements. Sensing circuitry can be formed in the semiconductor material. Prior to forming the array of storage elements, a plurality of access transistors can be formed in the base substrate material. The particular concentration of doping ions can be higher than a concentration of doping ions of the base substrate material. Global metal interconnects and pads can be formed over the sensing circuitry.

Figure 5:
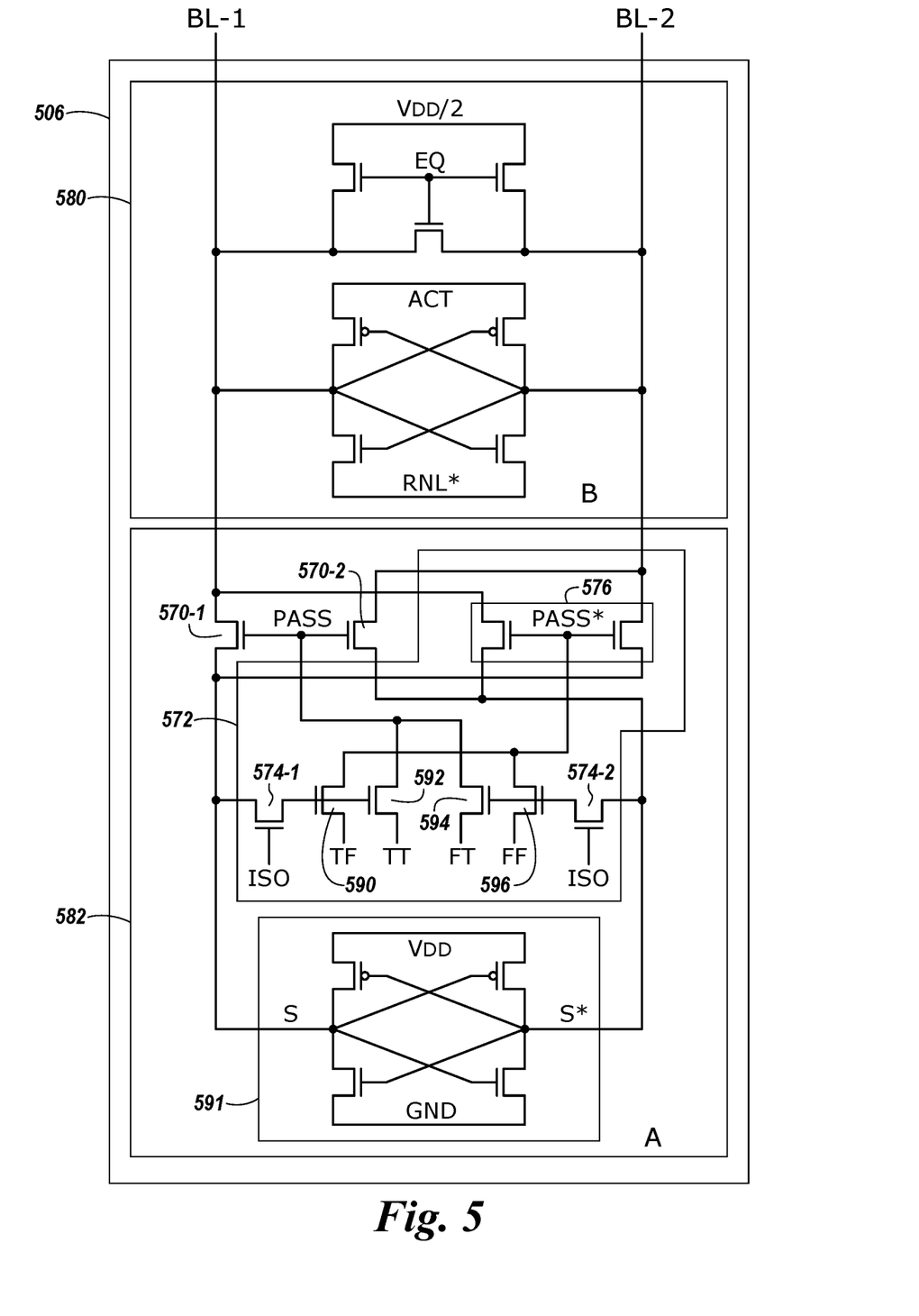
FIG. 5 is a schematic diagram illustrating sensing circuitry in accordance with a number of embodiments of the present disclosure.

FIG. 5 is a schematic diagram illustrating sensing circuitry 506 in accordance with a number of embodiments of the present disclosure. The sensing circuitry 506 can be analogous to the sensing circuitry 106 illustrated in FIG. 1. The sensing circuitry 506 can include a sense amplifier 580, which can be analogous to the sense amplifiers 380 and 380*a* illustrated in FIG. 3, and a compute component 582, which can be analogous to the compute components 382 and 382*a* illustrated in FIG. 3. The compute component 582 can comprise a plurality of compute transistors. FIG. 5 shows a sense amplifier 580 coupled to a pair of complementary digit lines BL-1 and BL-2 (which can be analogous to the pair of complementary digit lines BL-1 and BL-2 and BL-1 and BL-2 illustrated in FIGS. 3 and 4). The compute component 582 is coupled to the sense amplifier 580 via pass transistors 570-1 and 570-2. The gates of the pass transistors 570-1 and 570-2 can be controlled by a logical operation selection logic signal, PASS, which can be output from logical operation selection logic 572. FIG. 5 shows the compute component 582 labeled "A" and the sense amplifier 580 labeled "B" to indicate that the data value stored in the compute component 582 is the "A" data value and the data value stored in the sense amplifier 580 is the "B" data value shown in the logic tables illustrated with respect to FIG. 6.

The selectable logical operation selection logic 572 includes the swap transistors 576, as well as logic to drive the swap transistors 576. The logical operation selection logic 572 includes four logic selection transistors: a logic selection transistor 590 coupled between the gates of the swap transistors 576 and a TF signal control line, a logic selection transistor 592 coupled between the gates of the pass transistors 570-1 and 570-2 and a TT signal control line, a logic selection transistor 594 coupled between the gates of the pass transistors 570-1 and 570-2 and a FT signal control line, and a logic selection transistor 596 coupled between the gates of the swap transistors 576 and a FF signal control line. Gates of the logic selection transistors 590 and 592 are coupled to the true digit line BL-1 through isolation transistor 574-1 (having a gate coupled to an ISO signal control line). Gates of the logic selection transistors 594 and 596 are coupled to the complementary digit line BL-2 through isolation transistor 574-2 (also having a gate coupled to an ISO signal control line).

Figure 6:
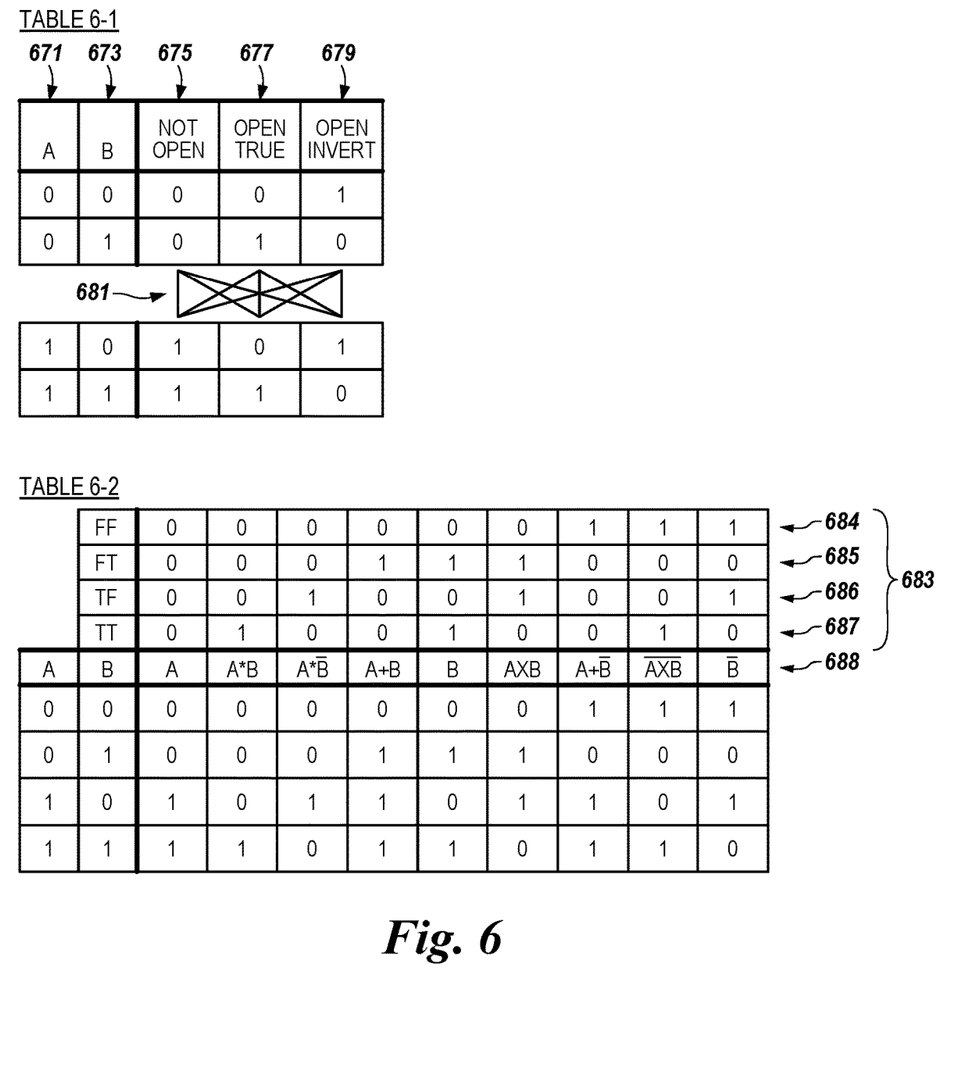
FIG. 6 is a logic table illustrating selectable logic operation results implemented by sensing circuitry in accordance with a number of embodiments of the present disclosure.

The plurality of compute transistors of the compute component 582 can include, but are not limited to, the logic selection transistors 590, 592, 594, and 596. That is to say that the logic selection transistors 590, 592, 594, and 596 are a subset of the plurality of compute transistors. As illustrated in FIG. 6, logic selection control signals can be applied to the logic selection transistors 590, 592, 594, and 596 to perform a particular logical operation. Thus, the logic selection transistors 590, 592, 594, and 596 can comprise a semiconductor material (e.g., the second semiconductor material 264 illustrated in FIG. 2), which is formed after the processing steps (e.g., heating cycles cycles) associated with forming storage elements. As a result, when the semiconductor material is doped to a particular concentration of doping ions, the particular concentration can be maintained. The particular concentration can be higher than that of other semiconductor materials of an IMI device. As a result, the logic selection transistors 590, 592, 594, and 596 can be doped to high concentration of doping ions such that the logic selection transistors 590, 592, 594, and 596 have short switching times corresponding to faster operation of an IMI device.

Operation of the logic selection transistors 590 and 596 are based on the state of the TF and FF selection signals and the data values on the respective complementary digit lines at the time the ISO signal is activated/deactivated. The logic selection transistors 590 and 596 also operate in a manner to control the swap transistors 576. For instance, to OPEN (e.g., turn on) the swap transistors 576, either the TF control signal is activated (e.g., high) with data value on the true digit line BL-1 being "1," or the FF control signal is activated (e.g., high) with the data value on the complement digit line BL-2 being "1." If either the respective control signal or the data value on the corresponding digit line (e.g., the digit line to which the gate of the particular logic selection transistor is coupled) is not high, then the swap transistors 576 will not be OPENed despite conduction of a particular logic selection transistor 590 and 596.

The PASS* control signal is not necessarily complementary to the PASS control signal. It is possible for the PASS and PASS* control signals to both be activated or both be deactivated at the same time. However, activation of both the PASS and PASS* control signals at the same time shorts the pair of complementary digit lines BL-1 and BL-2 together. Logical operations results for the sensing circuitry illustrated in FIG. 5 are summarized in the logic table illustrated in FIG. 6.

The sense amplifier 580 can, in conjunction with the compute component 582, be operated to perform various logical operations using data from an array as an input. In a number of embodiments, the result of a logical operation can be stored back to the array without transferring the data via a digit line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments can eliminate the need to transfer data across I/O lines in order to perform compute functions (e.g., between memory and discrete processor), a number of embodiments can enable an increased parallel processing capability as compared to previous approaches.

The sense amplifier 580 can further include equilibration circuitry, which can be configured to equilibrate the pair of complementary digit lines BL-1 and BL-2. In this example, the equilibration circuitry comprises a transistor coupled between the pair of complementary digit lines BL-1 and BL-2. The equilibration circuitry also comprises transistors each having a first source/drain region coupled to an equilibration voltage (e.g., $V_{DD}/2$), where $V_{DD}$ is a supply voltage associated with the array. A second source/drain region of a transistor can be coupled to the digit line BL-1, and a second source/drain region of a transistor can be coupled to the digit line BL-2. Gates of the transistors can be coupled together, and to an equilibration (EQ) control signal line. As such, activating EQ enables the transistors, which effectively shorts the pair of complementary digit lines BL-1 and BL-2 together and to the equilibration voltage (e.g., $V_{DD}/2$).

Although FIG. 5 shows sense amplifier 580 comprising the equilibration circuitry, embodiments are not so limited, and the equilibration circuitry may be implemented discretely from the sense amplifier 580, implemented in a different configuration than that shown in FIG. 5, or not implemented at all.

As shown in FIG. 5, the compute component 582 can also comprise a latch 591. The latch 591 can include a pair of cross coupled p-channel transistors (e.g., PMOS transistors) having their respective sources coupled to a supply voltage (e.g., $V_{DD}$). The latch 591 can include a pair of cross coupled n-channel transistors (e.g., NMOS transistors) having their respective sources selectively coupled to a reference voltage (e.g., ground), such that the latch 591 is continuously enabled. The configuration of the compute component 582 is not limited to that shown in FIG. 5.

FIG. 6 is a logic table illustrating selectable logic operation results implemented by sensing circuitry (e.g., sensing circuitry 506 shown in FIG. 5) in accordance with a number of embodiments of the present disclosure. The four logic selection control signals (e.g., TF, TT, FT, and FF), in conjunction with a particular data value present on the complementary digit lines (e.g., the pair of complementary digit lines BL-1 and BL-2 shown in FIG. 5), can be used to select one of a plurality of logical operations to implement involving the starting data values stored in the sense amplifier 580 and the compute component 582. The four logic selection control signals (e.g., TF, TT, FT, and FF), in conjunction with a particular data value present on the complementary digit lines (e.g., on nodes S and S*), controls the pass transistors 570-1 and 570-2 and swap transistors 576, which in turn affects the data value in the compute component 582 and/or sense amplifier 580 before/after firing. The capability to selectably control the swap transistors 576 facilitates implementing logical operations involving inverse data values (e.g., inverse operands and/or inverse result), among others.

Logic Table 6-1 illustrated in FIG. 6 shows the starting data value stored in the compute component 582 shown in column A at 671, and the starting data value stored in the sense amplifier 580 shown in column B at 673. The other three column headings in Logic Table 6-1 refer to the state of the pass transistors 570-1 and 570-2 and the swap transistors 576, which can respectively be controlled to be OPEN or CLOSED depending on the state of the four logic selection control signals (e.g., TF, TT, FT, and FF), in conjunction with a particular data value present on the pair of complementary digit lines BL-1 and BL-2 when the ISO control signal is asserted. The "NOT OPEN" column 675 corresponds to the pass transistors 570-1 and 570-2 and the swap transistors 576 both being in a non-conducting condition. The "OPEN TRUE" column 677 corresponds to the pass transistors 570-1 and 570-2 being in a conducting condition. The "OPEN INVERT" column 679 corresponds to the swap transistors 576 being in a conducting condition. The configuration corresponding to the pass transistors 570-1 and 570-2 and the swap transistors 576 both being in a conducting condition is not reflected in Logic Table 6-1 since this results in the digit lines being shorted together.

Via selective control of the pass transistors 570-1 and 570-2 and the swap transistors 576, each of the three columns 675, 677, and 679 of the upper portion of Logic Table 6-1 can be combined with each of the three columns 675, 677, and 679 of the lower portion of Logic Table 6-1 to provide nine (e.g., 3×3) different result combinations, corresponding to nine different logical operations, as indicated by the various connecting paths shown at 681. The nine different selectable logical operations that can be implemented by the sensing circuitry 506 are summarized in Logic Table 6-2.

The columns of Logic Table 6-2 show a heading 683 that includes the states of logic selection control signals (e.g., FF, FT, TF, TT). For example, the state of a first logic selection control signal (e.g., FF) is provided in row 684, the state of a second logic selection control signal (e.g., FT) is provided in row 685, the state of a third logic selection control signal (e.g., TF) is provided in row 686, and the state of a fourth logic selection control signal (e.g., TT) is provided in row 687. The particular logical operation corresponding to the results is summarized in row 688.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   an array of memory cells comprising a first plurality of transistors comprising a first semiconductor material; and
   a compute component formed over the array of memory cells and comprising a second plurality of transistors comprising a second semiconductor material having a different concentration of doping ions than the first semiconductor material,
   wherein the second semiconductor material has a higher concentration of doping ions than the first semiconductor material.

2. The apparatus of claim 1, further comprising a plurality of metal interconnects interconnecting the first plurality of transistors, the array of memory cells, and the compute component.

3. The apparatus of claim 1, wherein the first semiconductor material comprises an amorphous silicon first semiconductor material, and
   wherein the second semiconductor material comprises an amorphous silicon second semiconductor material.

4. The apparatus of claim 1, further comprising global metal interconnects and pads formed on the compute component.

5. The apparatus of claim 1, further comprising a sense amplifier coupled to the compute component, wherein the first plurality of transistors selectably couple respective memory cells of the array to the sense amplifier.

6. The apparatus of claim 5, wherein the sensing circuitry is configured to perform logic operations on data stored in the array of memory cells using at least one of the second plurality of transistors.

7. A method, comprising:
   forming, over an array of storage elements, a plurality of transistors comprising a semiconductor material;
   doping the semiconductor material to a higher concentration of doping ions than a concentration of doping ions of another semiconductor material of the array of storage elements; and
   forming sensing circuitry in the semiconductor material.

8. The method of claim 7, wherein forming the plurality of transistors comprises forming an amorphous silicon material over the array of storage elements.

9. The method of claim 7, further comprising doping the semiconductor material subsequent to all heating cycles associated with forming the array of storage elements.

10. The method of claim 7, wherein forming the sensing circuitry comprises:
    forming a compute component; and
    forming a sense amplifier coupled to the compute component.

11. The method of claim 10, further comprising forming a plurality of metal interconnects coupled to the plurality of transistors, the array of storage elements, and the compute component.

12. A method, comprising:
    forming, over an array of storage elements, a first plurality of transistors comprising a first semiconductor material and a second plurality of transistors comprising a second semiconductor material,
    wherein the second semiconductor material has a different concentration of doping ions than the first semiconductor material corresponding to a higher leakage current of the second plurality of transistors than that of the first plurality of transistors.

13. The method of claim 12, wherein the second semiconductor material has a higher concentration of doping ions than the first semiconductor material.

14. The method of claim 12, wherein the second semiconductor material has a lower concentration of doping ions than the first semiconductor material.

15. An apparatus, comprising:
    an array of memory cells comprising a first plurality of transistors comprising a first semiconductor material; and
    a compute component formed over the array of memory cells and comprising a second plurality of transistors comprising a second semiconductor material having a different concentration of doping ions than the first semiconductor material,
    wherein the second semiconductor material has a lower concentration of doping ions than the first semiconductor material.

16. An apparatus, comprising:
    an array of memory cells comprising a first plurality of transistors comprising a first semiconductor material; and
    a compute component formed over the array of memory cells and comprising a second plurality of transistors comprising a second semiconductor material having a different concentration of doping ions than the first semiconductor material,
    wherein the different concentration of doping ions corresponds to a shorter refresh cycle of the second plurality of transistors than that of the first plurality of transistors.

17. A method, comprising:
    forming, over an array of storage elements, a plurality of transistors comprising a semiconductor material;
    doping the semiconductor material to a lower concentration of doping ions than a concentration of doping ions of another semiconductor material of the array of storage elements; and
    forming sensing circuitry in the semiconductor material.

* * * * *